(12) United States Patent
Thiesen et al.

(10) Patent No.: US 7,471,033 B2
(45) Date of Patent: Dec. 30, 2008

(54) ENERGY HARVESTER WITH ADJUSTABLE RESONANT FREQUENCY

(75) Inventors: Jack Thiesen, Easley, SC (US); George Phillips O'Brien, Piedmont, SC (US)

(73) Assignee: Michelin Recherche et Technique S.A., Granges-Paccot (CH)

( * ) Notice: Subject to any disclaimer, the term of this patent is extended or adjusted under 35 U.S.C. 154(b) by 12 days.

(21) Appl. No.: 11/597,824

(22) PCT Filed: Oct. 21, 2004

(86) PCT No.: PCT/US2004/034700

§ 371 (c)(1),
(2), (4) Date: Aug. 8, 2007

(87) PCT Pub. No.: WO2006/046937

PCT Pub. Date: May 4, 2006

(65) Prior Publication Data

US 2008/0129147 A1 Jun. 5, 2008

(51) Int. Cl.
*H01L 41/113* (2006.01)
(52) U.S. Cl. .............. 310/339; 310/318; 310/319
(58) Field of Classification Search ......... 310/317–319, 310/339, 348
See application file for complete search history.

(56) References Cited

U.S. PATENT DOCUMENTS

| | | | |
|---|---|---|---|
| 3,760,351 A | 9/1973 | Thomas | |
| 4,061,200 A | 12/1977 | Thompson | |
| 4,467,236 A * | 8/1984 | Kolm et al. ............ | 310/321 |
| 4,510,484 A | 4/1985 | Snyder | |
| 4,862,486 A | 8/1989 | Wing et al. | |
| 5,457,447 A | 10/1995 | Ghaem et al. | |
| 5,749,984 A | 5/1998 | Frey et al. | |
| 5,801,475 A * | 9/1998 | Kimura ................. | 310/319 |
| 5,869,189 A | 2/1999 | Hagood, IV et al. | |
| 6,048,622 A | 4/2000 | Hagood, IV et al. | |
| 6,252,336 B1 * | 6/2001 | Hall ........................ | 310/339 |
| 6,407,484 B1 * | 6/2002 | Oliver et al. ............ | 310/339 |
| 6,479,920 B1 * | 11/2002 | Lal et al. ................ | 310/309 |
| 2005/0146220 A1 * | 7/2005 | Hamel et al. ............ | 307/44 |

FOREIGN PATENT DOCUMENTS

WO WO 2005/036728 A2 4/2005

OTHER PUBLICATIONS

Rainbow Ceramics: Processing Techniques; Piezoelectric, Dielectric and Pyroelectric Properties; and Polarization Distributions as Determined with SLIMM by Lang and Li, *Journal of the Korean Physical Society*, vol. 32, Feb. 1998, pp. S1268-S1270.

* cited by examiner

*Primary Examiner*—Thomas M Dougherty
(74) *Attorney, Agent, or Firm*—Dority & Manning, P.A.

(57) ABSTRACT

The present subject matter discloses devices, systems, and methodologies for harvesting power from environmentally induced vibrations. Piezoelectric devices (24) and structures are disclosed that may be employed in combination with electro-magnetic (100) or capacitive (92, 94) elements to enhance the power harvesting capabilities of the piezoelectric devices (24). The electromagnetic (100) and capacitive (92, 94) elements may be used to assist in maintaining system mechanical resonance in order to maximize energy harvesting capabilities. Power harvesting devices and systems in accordance with the subject technology may concurrently operate as sensors in motion sensitive applications thus providing self-powered monitoring capabilities.

10 Claims, 4 Drawing Sheets

ENERGY HARVESTER WITH ADJUSTABLE RESONANT FREQUENCY

FIELD OF THE INVENTION

The present invention generally concerns a compact, miniaturized apparatus and corresponding methodology for harvesting energy generated by a piezoelectric structure exposed to mechanical energy and vibration of host structures. Host structures may correspond to virtually any physical apparatus but the present technology is particularly well suited for integration with sensor applications.

BACKGROUND OF THE INVENTION

In many sensor applications, there is a need for power to operate associated electrical components yet it is often inconvenient, due to maintenance issues, or impossible due to space and mass limitations, to provide this power by conventional means such as batteries or combustion processes. In this light it would be highly advantageous to be able to realize a compact miniaturized power harvesting systems that could glean ambient power, i.e. power stored in local vibrations, and convert this into useful electricity. It would be even more advantageous if the same technology that generated the power could also be used as a sensor since such could greatly simplify the sensor design and reduce the overall package size. Finally, since the largest amounts of energy can be gained from mechanically resonant systems, it would be most advantageous if the resonance of such a power-harvesting sensor could have it's mechanical resonance adjusted dynamically under electronic control.

Applications for such technology might include a remotely distributed after-market sensor suite that could be employed on a vibrating machine to provide self-powered sensors for sensing and even communications such as RF transmission. Such an arrangement would be very convenient from an installation and maintenance point of view. Structural health monitoring using a distributed sensor network that is not only independently powered but independently reporting.

A power-harvesting device of this type could also be used in geophysical prospecting or as an alarm/data recorder for natural geophysical events. In the prospecting case, the vibrational energy from an energy source such as a vibrator could be used to power remote transmission of data. This would greatly simplify the distribution of seismic recording devices since it would remove the need for cabling. Such a system could also include a GPS receiver so that the step of surveying could also be eliminated from geophone placement during land surveys. Power to operate the device could come from the vibrations associated with physically carrying the device and deploying it on the survey site as well as the energy generated from seismic waves. In the case of geophysical event monitoring, an array of geophones could be placed remotely around a likely event epicenter and begin transmitting information at the occurrence of an event. By eliminating batteries from the transmission system, these sensors can be made cheaply, which might be advantageous if they were to become damaged as in the case of volcanic or other geological activity.

Such a system could also be used as an alarm in military or security applications where the generated power from the vibration of military or other vehicles could wake up the sensor and allow for a warning transmission. In all of these applications, a study of the vibrational spectrum could also be used to provide information about the health of the system or to identify a particular event or even a particular vehicle. Such devices could also be used to power pacemakers or other invasive health monitoring or health support systems where power could be generated from the motion of the wearer.

Another potential application relates to tires and sensors for tires. In many in-tire sensor suits there is a recognized need for continuous data transmission. This need arises for safety and performance reasons. For example, while temperature and pressure may change slowly during the course of normal operation, one of the real benefits of in-tire temperature and pressure monitoring is to alert the driver to potential catastrophic failures before they occur. Such failure events can develop very rapidly at high speeds; hence a need exists for more continuous monitoring. U.S. Pat. No. 5,749,984 (Frey et al.) discloses a tire monitoring system and method that is capable of determining such information as tire deflection, tire speed, and number of tire revolutions. Another example of a tire electronics system can be found in U.S. Pat. No. 4,510,484 (Snyder), which concerns an abnormal tire condition warning system. U.S. Pat. No. 4,862,486 (Wing et al.) also relates to tire electronics, and more particularly discloses an exemplary revolution counter for use in conjunction with automotive and truck tires.

Further there is a recognized benefit in allowing vehicle tires to act as real-time sensors that interact with a number of vehicle control systems, non-limiting examples of which include anti-lock braking systems (ABS), steering control, and traction control. In such applications it is critical that information be transmitted continuously and with minimum temporal bias to the relevant control system. Such requirements force the consideration of continuous data transmission and methods of powering continuous data transmission devices. A typical solution for powering tire electronics systems corresponds to the use of a non-rechargeable battery, which inherently provides an inconvenience to the tire user since proper electronics system operation is dependent on periodic battery replacement. Conventional batteries also often contain heavy metals that are not environmentally friendly and which present disposal concerns, especially when employed in significant quantities. Still further, batteries tend to deplete their energy storage quite rapidly when powering electronic applications characterized by complex levels of functionality. Battery storage depletion is especially prevalent in electronic systems that transmit information over a relatively far distance such as from truck wheel locations to a receiver in the truck cabin. In such considerations, it is readily apparent that batteries are undesirable for many reasons. Therefore it would be a major advance in the art to find a means of scavenging power from vibration and deformation sources intrinsic to the tire.

Yet another potential capability offered by electronics systems integrated with tire structures corresponds to asset tracking and performance characterization for commercial vehicular applications. Commercial truck fleets, aviation crafts and earthmover/mining vehicles are all viable industries that could utilize the benefits of self-powered tire electronic systems and related information transmission. Self-powered sensors could determine the distance each tire in a vehicle has traveled and thus aid in maintenance planning for such commercial systems. Vehicle location and performance can be optimized for more expensive applications such as those concerning earth-mining equipment. Entire fleets of vehicles could be tracked using RF tag transmission, exemplary aspects of which are disclosed in U.S. Pat. No. 5,457,447 (Ghaem et al.).

Such integrated tire electronics systems have conventionally been powered by a variety of techniques and different power generation systems. Examples of mechanical features for generating energy from tire movement are disclosed in U.S. Pat. No. 4,061,200 (Thompson) and U.S. Pat. No. 3,760,351 (Thomas). Such examples provide bulky, complex systems that are generally not preferred for incorporation with modern tire applications. Yet another option for powering tire electronics systems is disclosed in U.S. Pat. No. 4,510,484 (Snyder), which concerns a piezoelectric reed power supply symmetrically configured about a radiating centerline of a tire.

It is appreciated that certain advantages of piezoelectric materials have long been recognized. However, such technology is constantly improving, thus potentially affording applications that utilize piezoelectric materials with improved operating capabilities. Examples of relatively new advances in piezoelectric technology are provided in U.S. Pat. No. 5,869,189 (Hagood, IV et al.) and U.S. Pat. No. 6,048,622 (Hagood, IV et al.), directed to composites for structural control. The presently disclosed technology concerns further advances in piezoelectric technology such that a piezoelectric power generating device can be miniaturized for purposes of energy harvesting and, in certain circumstances concurrently function as sensors and together can be integrated with virtually any vibration generating device or structure to provide self-powered systems and devices.

The disclosures of all of the foregoing United States patents are hereby fully incorporated into this application for all purposes by reference thereto. While various power generation systems have been developed, no design has emerged that generally encompasses all of the desired characteristics as hereafter presented in accordance with the subject technology.

BRIEF SUMMARY OF THE INVENTION

In view of the recognized features encountered in the prior art and addressed by the present subject matter, improved devices, systems and methodologies for harvesting vibrational energy have been developed. Piezoelectric technology is utilized to convert mechanical stress and strain associated with mechanical induced vibration to electric charge that may then be harvested to provide operating power for a host of various devices.

In accordance with certain aspects of the disclosed technology, miniaturized devices, systems and methodologies for manufacturing such devices that are capable of generating power from vibrational energy sources intrinsic to the environment in which the device may be employed are provided. The devices of the present technology can be manufactured in a compact form and can be scaled from meso-scale to micro-scale. Methodologies for manufacturing the devices of the present technology are compatible with the backend of standard CMOS processes, allowing these power-harvesters to be directly integrated into complex CMOS types processes so that system-on-a-chip packages may be developed. Alternative methodologies for manufacture of the devices of the present technology also include precision micro machining and casting. Micro machining offers the prospect of providing a device that is miniaturized to the point that a power generator may be packaged in such a way that it permits ready attachment to a packaged integrated circuit. It may even be possible to fit a monolithic power harvesting device and conditioning circuitry directly onto the die of an integrated circuit.

In accordance with more particular aspects of the disclosed technology, one aspect of the present subject matter is to provide self-powered electronic components. Such electronic components are self-powered by energy harvested from integrated piezoelectric structures and may correspond with numerous electronic applications. One exemplary electronic application concerns a tire monitoring system designed to measure and transmit information regarding tire conditions such as pressure and temperature, as well as other information such as the number of tire revolutions or general tire identification variables.

Another aspect of certain exemplary electronic applications of the present technology concerns geophysical monitoring systems designed to monitor and/or measure ground vibrations induced from naturally occurring events or as might be induced from the movement of vehicles or other machinery. Such applications might relate to the provision of self-powered monitoring devices designed to monitor for ground vibrations induced by earthquakes, volcanic activity, or other naturally occurring geologic events. Applications may also relate to the provision of self-powered monitoring devices for the detection of ground and other vibration induced by vehicles, machines, or living entities with respect to protective, safety, or military concerns.

Yet another other aspect of another exemplary application of the present technology concerns self-powered patient worn or implanted medical devices. Self-powered pacemakers and health monitoring devices may be powered by harvesting energy generated from the motion of the patient/wearer.

Various features and other aspects of the subject electronics system and specialized power-generating device of the preset technology offer a plurality of advantages. The disclosed technology provides for a self-powered electronics system that is not dependent on replacement of batteries. Although batteries and battery-operated devices may still be incorporated with aspects of the present subject matter, many complications regarding electronic devices that are solely powered by batteries are obviated in accordance with the present technology.

Yet another aspect of the present subject matter is that there are fewer limitations regarding the type and amount of electronic equipment capable of being operated by power sources provided by the present technology. Electronics powered by conventional methods other than as in accordance with the disclosed piezoelectric technology are often limited to ultra-low power devices. Devices in accordance with the presently disclosed technology are not necessarily subject to such extreme power limitations. This aspect of the presently disclosed technology further facilitates greater functionality of self-powered electronics, as more components and/or higher-level equipment may potentially be utilized.

A still further aspect of the present subject matter is that the disclosed system and method for generating power and utilizing such power can be used in accordance with a variety of existing applications. Measurement capabilities, monitoring and warning systems, vehicle feedback systems, and asset tracking potential may be possible for applications such as commercial truck fleets, airplanes, and mining/earthmover equipment.

One exemplary embodiment of the present subject matter corresponds to a methodology for electronically controlling the mechanical resonance of the system while increasing the amount of energy harvested. More particularly, embodiments of the present subject matter correspond to methodologies for applying force to moving components of the system to adjust the resonance of the system to correspond more closely to environmentally intrinsic vibrations. One of these embodiments involves the use of capacitor plates coupled between a piezoelectric device and its supporting structure. Another of these embodiments makes use of a magnet and coil arrangement.

Still other embodiments of the present subject matter correspond to methodologies for applying force to moving components of the system through the use of mechanical, electronic or electromagnetic methodologies in a double acting format.

Finally, yet still other embodiments of the present technology correspond to methodologies for embodying the present technology in a planar form suitable for fabrication using micro-machining techniques, photolithographic techniques, exfoliation processes, and wafer bonding techniques.

Additional aspects and advantages of the present subject matter are set forth in, or will be apparent to, those of ordinary skill in the art from the detailed description herein. Also, it should be further appreciated that modifications and variations to the specifically illustrated, referred and discussed features and steps hereof may be practiced in various embodiments and uses of the invention without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the present subject matter, not necessarily expressed in this summarized section, may include and incorporate various combinations of aspects of features, components, or steps referenced in the summarized objectives above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which.

Repeat use of reference characters throughout the present specification and appended drawings is intended to represent same or analogous features or elements of the invention.

DETAILED DESCRIPTION OF THE PREFERRED EMBODIMENTS

As discussed in the Brief Summary of the Invention section, the present subject matter particularly concerns improved systems and methodologies for harvesting power produced by mechanical vibrations using piezoelectric devices to provide operating power for various electronic systems and, optionally, to serve as sensors for such electronic systems.

Figure 1A:
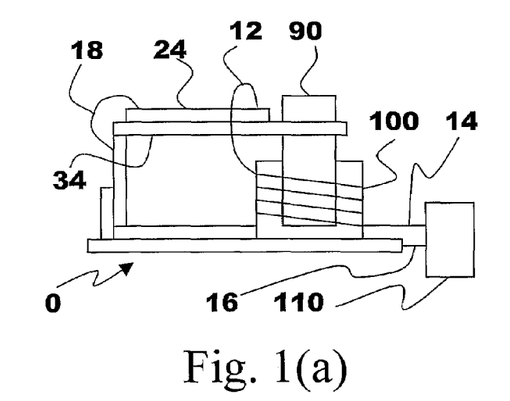
FIGS. 1(a) and 1(b) illustrate magnet and coil configurations useful for adjusting the mechanical resonant frequency of the energy harvesting system in accordance with an exemplary embodiment of the present subject matter.

FIG. 1(a) illustrates a first embodiment of the present subject matter. More specifically, FIG. 1(a) illustrates an embodiment of the present subject matter employing electromagnetic methodologies for harvesting energy that permits harvesting energy in amounts beyond those that would be expected from employing piezoelectric material alone. With specific reference to FIG. 1(a), the exemplary embodiment there illustrated shows a piezoelectric device 24 attached to a flexure member or cantilever beam 34. The piezoelectric device 24 may correspond to a piezoelectric single crystal, lead zirconate titanate (PZT), lead lanthanum zirconate titanate (PZLT), or other materials with piezoelectric properties. Alternatively, piezoelectric device 24 may correspond to a single crystal unimorph or may be fabricated using the oxide reduction techniques described in "Rainbow Ceramics: Processing Techniques; Piezoelectric, Dielectric and Pyroelectric Properties; and Polarization Distributions as Determined with SLIMM" by Lang and Li, Journal of the Korean Physical Society, Vol. 32, February 1998 which is hereby incorporated for all purposes.

Cantilever beam 34 corresponds to a non-piezoelectric material and may include such materials as brass, Ni, NiTi alloys, spring steel, FeNi alloys, and others. It should be clearly understood that the exact formulation of the components of a piezoelectric device usable with the present technology is not a limiting factor to the present subject matter but rather the present subject matter is primarily concerned with various arrangements of such piezoelectric devices as they relate to power harvesting configurations.

With further reference to FIG. 1(a), a proof mass 90 is attached to the free end of the cantilever beam 34. As the proof mass 90 accelerates due to environmentally induced vibration, the piezoelectric material of the piezoelectric device 24 is strained and charge is generated. Moreover, in accordance with the present subject matter, this embodiment of the present technology provides for the inclusion of additional energy harvesting elements in the form of a magnet and coil arrangement. In this configuration, proof mass 90 may correspond to a magnetic element that, when subject to externally induced vibration, vibrates in and out of coil 100 to generate electrical energy that may be added to the energy harvested from the environmentally induced vibrations producing strain in the piezoelectric device 24 portion of the combination. It should be appreciated that the energy produced by both the piezoelectric device 24 and the magnet and coil arrangement is dependent on the environmentally induced vibrations and thus, signals produced by either or both of the piezoelectric device 24 and/or the magnet and coil arrangement may be used as sensor signals indicative of the environmentally induced vibrations.

In accordance with a more particular feature of the present subject matter, the embodiment of the subject matter illustrated in FIG. 1(*a*) also illustrates another significant feature of the present subject matter in that the present subject matter provides the capability of dynamically controlling the resonant frequency of the mechanical system by way of control device 110. As may be seen from FIG. 1(*a*), piezoelectric device 24 is coupled at one end by way of conductor 18 to conductive support frame 20 and at the other end by conductor 12 to one end of electrical coil 100. The other end of electrical coil 100 is connected by way of conductor 14 to control device 110 and a conduction path to control circuit 110 is completed by way of conductor 16 connected to the conductive support frame 20. By controlling the voltage across coil 100 and/or the current through coil 100, the force exerted on the magnetic proof mass 90 by the electromagnetic field generated by the coil 100 may be controlled. Such control of the force applied to proof mass 90 may then be used to dynamically control the mechanical resonant frequency of the system, which, in turn, provides capability for optimizing the energy harvested from the system by matching the resonance of the mechanical structure to the frequency or frequencies of the existing vibrational modes.

Figure 1B:
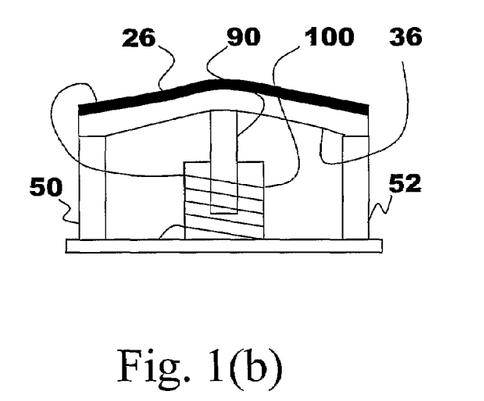

FIG. 1(*b*) illustrates another exemplary embodiment of the present subject matter wherein a doubly clamped piezoelectric device 26, the ends of which are supported by support structures 50, 52, replaces the cantilevered piezoelectric device 24 illustrated in FIG. 1(*a*). Magnetic proof mass 90, coupled to a mid-portion of piezoelectric device 26, and coil 100 are also employed in this embodiment of the present subject matter and perform similar functions to those described with respect to the embodiment of the present subject matter described with respect to FIG. 1(*a*). In this embodiment, piezoelectric device 26 may be implemented as a unimorph device, although other structures may be used. Although not illustrated in FIG. 1(*b*), a control circuit similar to control circuit 110 illustrated in FIG. 1(*a*) may be employed in combination with the piezoelectric device 26 and electrical coil 100 to dynamically control the mechanical resonant frequency or frequencies of the FIG. 1(*b*) system to optimize the energy harvested from the system by matching the resonance of the mechanical structure to the frequency or frequencies of the existing vibrational modes in the same manner as described with respect to FIG. 1(*a*).

Figure 1C:
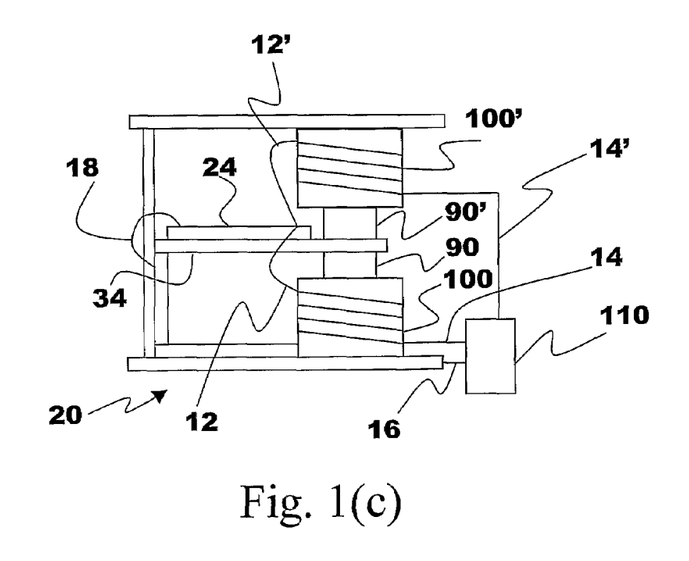
FIG. 1(c) illustrates a dual acting magnet and coil configuration embodiment of the present subject matter detailing one variation of the FIG. 1(a) embodiment providing enhanced energy harvesting capability.

FIG. 1(*c*) illustrates a modification of the embodiment of the present subject matter previously illustrated in FIG. 1(*a*). In this modification, an enhanced energy harvesting capability over that of the system illustrated in FIG. 1(*a*) is provided in a double acting format wherein a second electrical coil 100' and second magnetic proof mass 90' are configured to operate in concert with magnetic proof mass 90 and electrical coil 100 to double the added energy harvested. As with the embodiment illustrated in FIG. 1(*a*), a control circuit 110 may be coupled via conductor 14', conductor 18, electrical conductive frame 20 and conductor 16 to electrical coil 100' and piezoelectric device 24 to provide dynamic control of forces applied to magnetic proof masses 90, 90' in order to provide dynamic control of the mechanical resonant frequency or frequencies of the mechanical system thereby optimizing the energy harvested from the system by matching the resonance of the mechanical structure to the frequency or frequencies of the existing vibrational modes. Based on the foregoing, it should be apparent to those of ordinary skill in the art that this same doubly acting concept could be applied to the structure illustrated in FIG. 1(*b*) by duplicating components in the same manner as illustrated in FIG. 1(*c*).

Figure 2A:
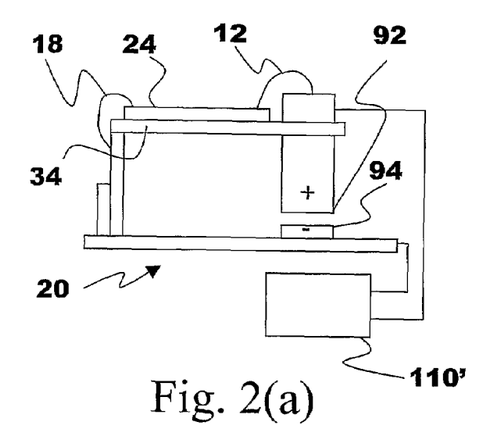
FIG. 2(a) illustrates an exemplary capacitive variation of the present subject matter reflective of the magnetic structure of FIG. 1(a)
Figure 2B:
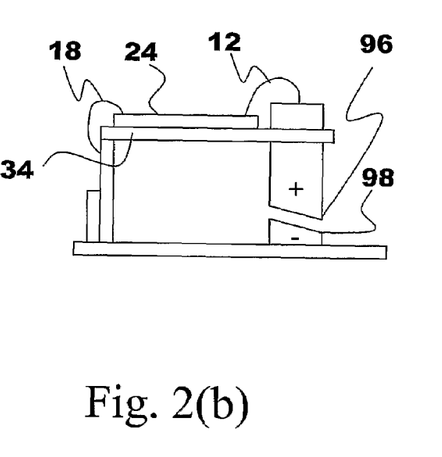
FIG. 2(b) illustrates structure similar to that of FIG. 2(a) but illustrating a modified angle between the proof mass and capacitor plates.

FIGS. 2(*a*) and 2(*b*) illustrate yet additional embodiments of the present subject matter. The embodiments illustrated in FIGS. 2(*a*) and 2(*b*) are similar to that of FIG. 1(*a*) in that there is provided a cantilevered beam 34 supporting a piezoelectric device 24 attached thereto. As indicated by their common numeric designations, piezoelectric device 24 and cantilevered beam 34 may be constructed in a similar fashion and from similar materials as that of their corresponding elements illustrated and described with respect to the embodiment of the present subject matter illustrated in FIG. 1(*a*).

Proof masses 92 (FIG. 2(*a*)) and 96 (FIG. 2(*b*)) provide a mechanical function similar to proof mass 90 of the previously illustrated embodiments, that is, as the proof mass 92 or 96 accelerates due to environmentally induced vibration, the piezoelectric material of the piezoelectric device 24 is strained and charge is generated. In this embodiment of the present subject matter, proof masses 92, 96 also provide dual functions in a manner similar to those functions provided by proof mass 90 of the previous embodiments. In the embodiment of the present subject matter illustrated in FIGS. 2(*a*) and 2(*b*), proof masses 92, 96 correspond to a moveable electrode of a capacitor. Consequently the materials from which proof masses 92, 96 may be constructed are not necessarily magnetic in nature, but rather the materials are, at least, electrically conductive. In like manner, elements 94 (FIG. 2(*a*)) and 98 (FIG. 2(*b*)) correspond to fixed electrodes of a capacitor that are supported, respectively, by conductive frame 20. The capacitors formed by electrodes 92, 94 and 96, 98 respectively cooperate with piezoelectric device 24 to assist in harvesting additional energy from induced vibrations in a manner not unlike that of the magnet and coil arrangement of the previous embodiment. In this embodiment, electric charge generated from the strain induced in the piezoelectric material 24 by way of movement of the proof masses 92, 96 in response to environmentally induced vibration is conveyed to the capacitors formed by electrodes 92, 94 and 96, 98 through the electrically conductive frame 20. Additional energy may be harvested from the system as environmental vibrations produce movement of the proof mass and resultant forced movement of the capacitor electrodes 92, 94 and 96, 98. The forced separation of charged capacitor plates will produce additional current flow within the circuit that results in additional energy harvesting capability.

As illustrated in the drawings, the embodiment illustrated in FIG. 2(*b*) differs from that of FIG. 2(*a*) by the angled orientation of the electrodes 96, 98. Such an angled configuration may be provided to accommodate possible capacitive fringing effects produced as the lever arm deflects.

Not to be overlooked in this embodiment also is the possibility of use of a control circuit 110' to effect dynamic control of the mechanical resonant frequency of the structure in order to optimize energy harvesting capabilities by matching the resonance of the structure to the frequency or frequencies of the existing vibrational modes. By controlling the voltage across and the current through the capacitors formed by electrode pairs 92, 94 and 96, 98, one may control the force applied to the proof mass and, thereby, control the mechanical resonant frequency of the system. It should also be appreciated that, like the magnet and coil motion generated signals in the previous embodiments, the variations in capacitance values resulting from motion between the capacitor elements may be employed as a motion sensitive sensor source.

Figure 2C:
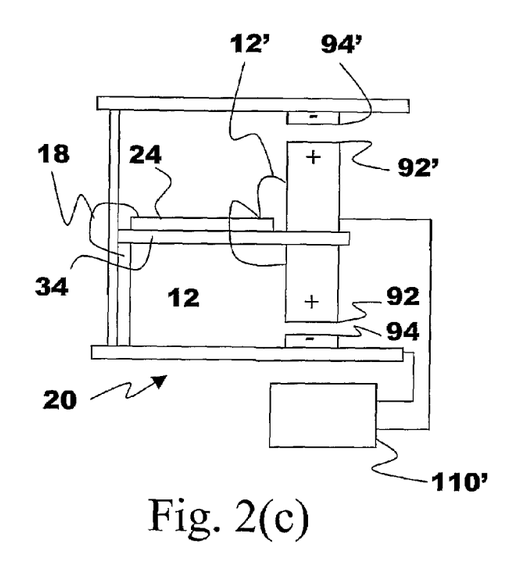
FIG. 2(c) illustrates a dual acting capacitor configuration of the present subject matter detailing one variation of the FIG. 2(a) embodiment providing enhanced energy harvesting capability.

With reference now to FIG. 2(*c*), it will be seen that there is the possibility of configuring the device previously illustrated in FIG. 2(a) in a double acting piezoelectric and dual capacitive combination format in much the same manner as was illustrated in FIG. 1(c) with respect to a piezoelectric and dual coil combination. Moreover, as illustrated in FIG. 2(c), a control circuit, 110' may be used in combination with such a doubly acting configuration to provide controlled loading of the opposed capacitors, and therefore, control of the mechanical resonant frequency of the system producing optimized energy harvesting capabilities.

Figure 3A:
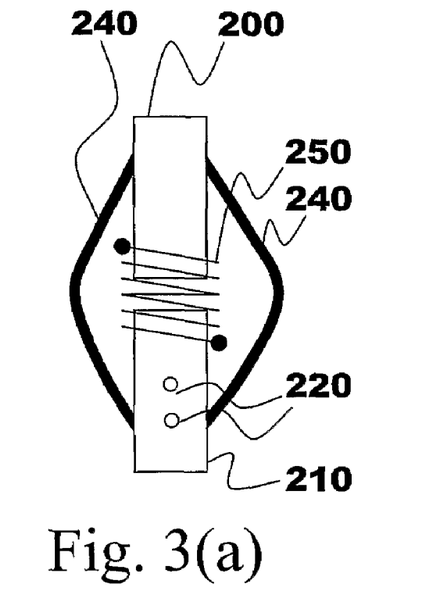
FIGS. 3(a), 3(b), and 3(c) illustrate alternative exemplary embodiments of the present subject matter wherein the piezoelectric devices are employed as springs and magnetic as well as capacitive energy harvesting enhancements are provided.
Figure 3B:
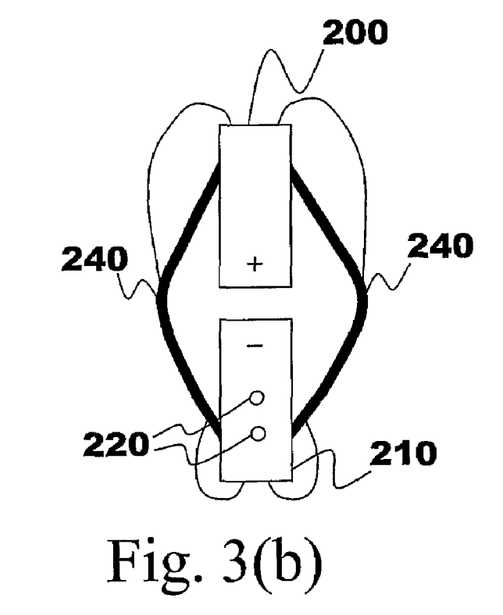
Figure 3C:
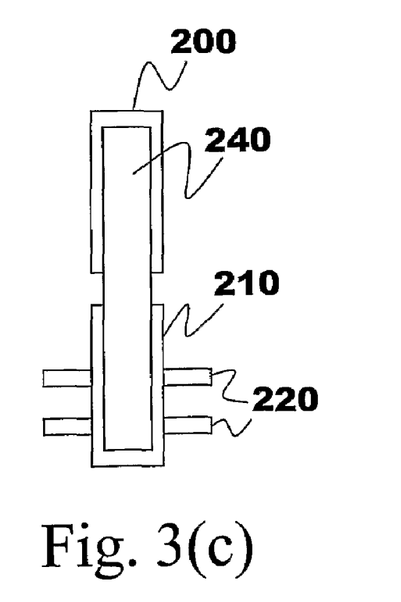

FIGS. 3(a), 3(b), and 3(c) illustrates yet other exemplary embodiments of the present subject matter. In these embodiments, an upper proof mass 200 may be accelerated toward a lower mass 210 by the force of environmentally induced vibrations. Pins 220 rigidly hold the lower mass in place against a support structure (not shown). In this configuration, a pair of stressed piezoelectric elements 240 form springs and provide a restoring force against the force of any environmentally induced vibrations. Flexure of the piezoelectric elements 240 results in strain in the elements and, consequently, generation of electrical energy that may be harvested by suitable means. As illustrated, either the previously discussed electromagnetic or capacitive enhancement to the basic power harvesting capability may be provided. FIG. 3(a) illustrates a possible electromagnetic enhancement through placement of a coil 250 such that the upper proof mass 200 passes in and out of coil 250 to produce harvestable current flow within the coil 250, while FIG. 3(b) indicates positive (+) and negative (−) polarities where the end portions of the proof masses 200, 210 form capacitive plates and, likewise, are capable of providing additional harvestable energy in a manner similar to the previously described embodiments. As illustrated, FIG. 3(b) represents a front view of a capacitively enhanced embodiment of an exemplary embodiment of a power harvester in accordance with the present subject matter while FIG. 3(c) represents a side view of the power-harvesting device.

It should be appreciated that, as with the embodiments illustrated in FIGS. 1(a) and 2(a), an external control circuit (not shown) may be configured to control the voltage and current flow through coil 250 of the FIG. 3(a) embodiment of the present subject matter as well as to control the voltage across and current through the capacitor formed by electrodes 200 and 210 in the embodiment illustrated in FIGS. 3(b) and 3(c) whereby controlled forces may be generated to dynamically control the resonance of the mechanical systems to optimize energy harvesting operations. It is also possible in these embodiments, to employ the piezoelectric devices themselves as the force generating elements, as it is well know that such devices not only produce energy when subjected to strain, but also flex when energy is applied. Moreover, it should also be appreciated that doubly acting configurations of these devices are also possible.

Figure 4A:
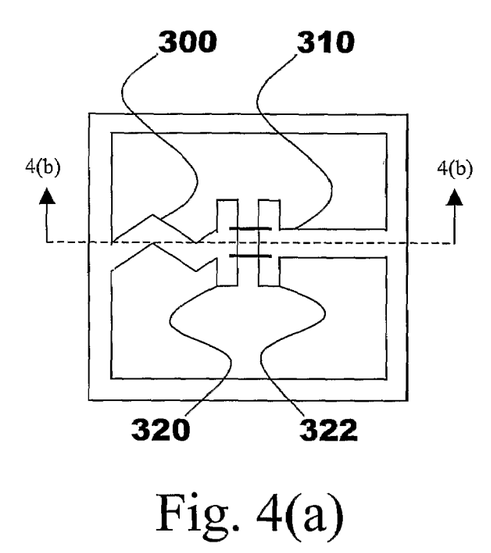
FIGS. 4(a) and 4(b) illustrate plan and side elevation views respectively of a first exemplary embodiment of a planar configuration of the present subject matter suitable for implementation in micro electromechanical systems (MEMS).
Figure 4B:
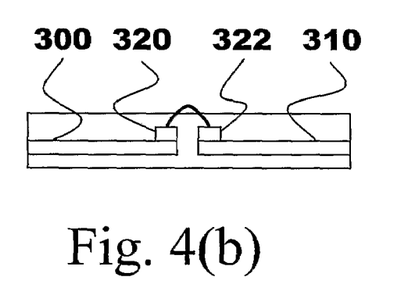

FIGS. 4(a) and 4(b) illustrate methodologies by which the basic concepts herein presented may be embodied in a planarized micro-electromechanical system (MEMS) format. A planar transformation of the basic configurations previously presented allows the present subject matter to be fabricated using typical micro-machining techniques. FIGS. 4(a) and 4(b) respectively illustrate plan and side elevation views of a first planar embodiment of the present subject matter. As illustrated, a spring member 300 that may have a piezoelectric layer affixed thereto extends toward a rigid member 310. These members may have capacitor plates 320, 322 attached to them and will operate in a manner very similar to many of the previously described capacitively enhanced embodiments of the present subject matter. In addition, this planar configuration of the present subject matter may also include control circuitry providing dynamic resonant frequency control in a manner similar to the previously discussed embodiments. It should also be clear to those of ordinary skill in the art that planar embodiments of the present subject matter could be made double acting by configuring a mirror image of the illustrated device in a reciprocal relationship.

One of the problems associated with using many thin-film piezoelectric materials for micro-electromechanical system (MEMS) type applications is the incompatibility of piezoelectric thin-film depositions processes with silicon device processes. Some of these drawbacks include the diffusion of silicon (Si) into the piezoelectric film, which poisons the film reducing or destroying the piezoelectric properties and the high temperatures of deposition required to produce thin-films with acceptable piezoelectric activity, such temperatures being incompatible with the thermal budget of back-end silicon device manufacturing processes.

Other drawbacks of devices based on piezoelectric films for MEMS applications involve etch selectivity and patterning. These issues make the realization of such devices complex and expensive, often requiring the use of exotic material systems and son-standard fabrication processes. Another issue with piezoelectric thin-films is that most deposition techniques produce polycrystalline layers, which have both reduced electrical and mechanical performance as compared to single crystal piezoelectric materials. A final drawback to using piezoelectric thin-films is the fact that the films are typically mechanically fragile. On the other hand, MEMS devices are often designed for rather large strains. Given these considerations, it is advantageous to consider a fabrication methodology that might be able to overcome strain limitations in such devices.

In order to address these problems, the present subject matter discloses a methodology whereby such device may be realized using standard wet chemical etches, standard photolithographic techniques, standard exfoliation processes, and standard wafer bonding techniques. This technique also offers the possibility of fabricating mechanically advantageous single-crystal/metal unimorphs with coefficient of thermal expansion (CTE) induced internal stress to mechanically strengthen the piezoelectric layers. The mechanical strengthening of the piezoelectric layers in this way allows them to survive large mechanical deflections.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. An energy harvesting apparatus for harvesting and converting environmentally intrinsic vibrational energy into electrical energy comprising:
   a piezoelectric device;
   a support structure securing at least one portion of said piezoelectric device from relative motion along at least one axis;
   a proof mass coupled to a second portion of said piezoelectric device; and
   a force generating means for applying a controllable force to said proof mass,
   whereby environmentally intrinsic vibrational energy produces movement of the proof mass and consequent strain in the piezoelectric device thereby producing electrical energy and said force generating means adjusts the resonant frequency of the energy harvesting apparatus to conform with the frequency or frequencies of existing environmentally intrinsic vibrational energy.

2. An energy harvesting apparatus as in claim 1, wherein said force generating means comprises at least one motion sensitive electrical element coupled to said proof mass for enhancing the energy harvesting capabilities of said energy harvesting apparatus.

3. An energy harvesting apparatus as in claim 2, wherein the motion sensitive electrical element comprises at least one capacitor and wherein the value of electrical capacitance of said at least one capacitor varies in dependence on environmentally intrinsic vibrational energy.

4. An energy harvesting apparatus as in claim 2, wherein the motion sensitive electrical element comprises an electromagnetic coil magnetically coupled to said proof mass.

5. An energy harvesting apparatus as in claim 2, wherein the motion sensitive electrical element comprises a second piezoelectric device coupled to said proof mass.

6. An energy harvesting apparatus as in claim 1, further comprising:
a second force generating means coupled to said proof mass in opposed orientation to said force generating means, whereby alternate operation of the force generating means and the second force generating means provides a double acting energy harvesting capability.

7. An energy harvesting apparatus as in claim 6, wherein said force generating means and said second force generating means both comprise magnetic means.

8. An energy harvesting apparatus as in claim 6, wherein said force generating means and said second force generating means both comprise capacitive means.

9. An energy harvesting apparatus as in claim 1, wherein said force generating means further comprises circuitry for dynamically controlling the force generate by the force generating means.

10. An energy harvesting apparatus as in claim 3, wherein said piezoelectric device, said support structure and said capacitor are aligned in a common plane.

* * * * *